US006893676B2

(12) United States Patent
Alif

(10) Patent No.: US 6,893,676 B2
(45) Date of Patent: May 17, 2005

(54) GLOW IN THE DARK PUFF HEAT TRANSFER METHOD AND COMPOSITION

(75) Inventor: Nidal Alif, Pompano Beach, FL (US)

(73) Assignee: Next Graphics, Inc., Pompano Beach, FL (US)

( * ) Notice: Subject to any disclaimer, the term of this patent is extended or adjusted under 35 U.S.C. 154(b) by 134 days.

(21) Appl. No.: 10/310,241

(22) Filed: Dec. 5, 2002

(65) Prior Publication Data

US 2004/0108491 A1 Jun. 10, 2004

(51) Int. Cl.[7] ................................................ G03F 7/12
(52) U.S. Cl. ...................... 427/148; 428/343; 428/511; 430/301; 430/308; 101/115
(58) Field of Search ......................... 427/148; 428/343, 428/511; 430/301, 308; 101/115

(56) References Cited

U.S. PATENT DOCUMENTS

| | | | |
|---|---|---|---|
| 4,715,914 A | | 12/1987 | Viner |
| 4,966,815 A | | 10/1990 | Hare |
| 5,126,186 A | * | 6/1992 | Cheek ..................... 428/195.1 |
| 5,263,862 A | | 11/1993 | Claytor |
| 5,798,179 A | | 8/1998 | Kronzer |
| 6,232,041 B1 | | 5/2001 | Roberts et al. |
| 6,544,370 B1 | * | 4/2003 | Roberts et al. ............. 156/230 |
| 2002/0119308 A1 | | 8/2002 | Roberts et al. |

OTHER PUBLICATIONS

Wholesale Glow Powder. Photoluminescent Glow Pigments. [online]. The Glow Pro [retrieved on Oct. 18, 2004]. Retrieved from the Internet: <URL: http:/www.theglowpro-.com/powders.html>.*

* cited by examiner

Primary Examiner—Barbara L. Gilliam
(74) Attorney, Agent, or Firm—Christopher & Weisberg, P.A.

(57) ABSTRACT

A method of making a glow in the dark puff heat transfer material and a composition of glow in the dark puff heat transfer material are presented in this invention. Unlike many prior art heat transfer methods, the heat transfer method utilized in the present invention adheres to OSHA regulations 29 CFR 1910.1017. The process of making the glow in the dark puff heat transfer material comprises the steps of applying one or more layers of a specific glowing material between the colors layers. The composition comprises specific amounts of a glow clear base, glow puff material, translucent inks, and an effective amount of glowing material. A printable adhesive base may be added to the composition if the glowing material is not mixed with the glow clear base or with the glow puff material. The composition is printed on a paper substrate and cured through a conventional dryer. By applying the glow-in-the-dark puff heat transfer material to a piece of cloth material, for example, a soft, high-raised design that glows in the dark and is 95% free of the toxic gases and fumes that might cause health problems to the applicant, is produced.

7 Claims, 15 Drawing Sheets

GLOW IN THE DARK PUFF HEAT TRANSFER METHOD AND COMPOSITION

CROSS-REFERENCE TO RELATED APPLICATION n/a

STATEMENT REGARDING FEDERALLY SPONSORED RESEARCH OR DEVELOPMENT n/a

FIELD OF THE INVENTION

This invention relates generally to a heat transfer composition and a method of decorating fabrics using iron-on or heat transfers and specifically to a heat transfer composition and method that utilizes a limited and specific amount of a glow base material to provide a heat transfer material with improved glow-in-the-dark decorative characteristics fully complying with Occupational Safety and Health Administration ("OSHA") regulations.

BACKGROUND OF THE INVENTION

The heat transfer industry involves the processes of silk screening or direct printing in which a mesh is used to deposit printable ink onto a substrate. The substrate typically used in a direct printing procedure is a fabric or an end-user item such as a T-shirt. However, in heat transfer methods, the substrate is paper or any paper-related product. The printed paper can be applied to the fabric using an iron or iron-on machine. Traditional heat transfer methods started in the 1960s using a process called spot color in which each color was printed separately. This process was very basic and, because of the use of plastisol inks, resulted in bright colors. However, it was not a cost effective process and had limited applications.

In the early 1990s, a new process was introduced known as CMYK Puff Heat Transfer. This process utilizes a transfer base material, four-color (or CMYK) inks, and puff base material. In this process, the transfer base material is applied on the substrate or paper followed by the CMYK colors, which are printed separately in no particular order. Finally, the puff base material is applied. "Puff" is the standard term used in the industry to describe material having a high-raised textured finish. The advantage of this process is that many pantone colors can be achieved by printing only the four process colors. The final print will have velvet-like feel after application due to the application of the puff base material. There are, however, two major disadvantages of this process. The first disadvantage is that the colors tend to have a dull-looking finish without any bright colors, unlike the spot process. The reason for this is that the puff base material dilutes more than 30% of the intensity or the strength of the actual printed inks. The second disadvantage arises from the toxic ingredients that are used in the transfer base material. Traditionally, to produce a quality CMYK puff heat transfer, the percentage of the transfer base material by weight should not be less than 20%, otherwise the image will not transfer from the paper substrate to the applied product.

Transfer base material is typically comprised of 75% polyvinyl chloride, 15–17% diisodecyl phthalate, 5% adhesive and 3% other ingredients included vinyl acetate. According to the OSHA Regulation 29 CFR 1910.1017, vinyl chloride in its vapor form, is a potential cancer suspect agent. According to the Consumer Law Page website (http://consumerlawpage.com), polyvinyl chloride may cause cancer with a latency period of 15 to 40 years if it is inhaled in smoke form. According to OSHA regulation 29 CFR 1910.178, vinyl acetate may cause tuberculosis. Finally, according to the International Programme of Chemical Safety ("IPCS"), diisodecy phthalate is a substance that may have damaging effects on the liver.

Application of a heat transfer to a fabric using an iron-on machine at 400° F., produces vinyl chloride after the image is peeled off the paper, which, if inhaled directly by the applicant, may produce health problems. In a typical heat transfer facility, a user can perform approximately ten average-size transfers in a 15 minute period. A heat transfer that contains 20% of a transfer base material typically contains 15% polyvinyl chloride, 3% diisodecy phthalate and portions of vinyl acetate. The ten transfers contain a total of approximately 1 gram of vinyl chloride in a vapor form concentration of 9.8 ppm, which exceeds OSHA regulation 1910.1017(c)(2) by 4.8 ppm. In order for a user to avoid the possibility of inhaling carcinogens or other related hazardous fumes, the vinyl chloride concentration should be below 5 ppm, which means each transfer applied should not contain more than 8% of polyvinyl chloride. Therefore, the heat transfer process should not have more than 10% of transfer base material. Tables 1 and 2, in the Detailed Description section below, illustrate this in terms of CMYK puff heat transfer composition and the concentration of the vapor form of vinyl chloride.

The present invention improves upon the traditional heat transfer process by using a limited and specific amount of an improved transfer base material that fully complies with OSHA regulations and results in an improved heat transfer material that glows in the dark for safer and more decorative characteristics.

SUMMARY OF THE INVENTION

The present invention is a Glow-In-The-Dark Puff Heat Transfer ("GWPHT") composition and a method for producing the same. The present invention advantageously provides a safe method of producing heat transfer material that exhibits glow-in-the-dark characteristics as well as comprising a high-raised texture, known in the industry as "puff", which can be applied on any colored fabric.

The invention comprises a series of steps starting with a user selecting and creating the required design using a computer, which generates computer images as is commonly known in the art. Additional computer-generated color layers may be added to the computer image to clarify which areas of the design are to be the glowing areas. The computer reads the image file colors and transfers them onto four plates, separately labeled, for example, Cyan, Magenta, Yellow, and Black. The extra layers for the glowing clear base and puff are created separately on different plates. Each plate image is sent to an image-setter to print them on acetate films, each film identified by name and consisting of a series of dots typically varying between 60 to 75 lines per inch, to represent the various colors. Each separate film is then affixed to a coated mesh screen. The screens are then exposed to an ultraviolet light. The ultraviolet light sensitizes the coating around the image and leaves the coating under the image dots desensitized to be washed away by water.

After the screen or mesh that contains the image is dried, it is loaded to a printing machine in the following preferred order: glowing base, glowing material, black glowing material, cyan glowing material, yellow glowing material, magenta glowing material, puff glowing material, followed by printable adhesive. The printing screens order might vary if the glowing material is mixed into the color to form a glowing color composition. The mesh on each screen is chosen carefully to control the color weight percentage. The percentages vary from one image to another but the percentages fall within a certain proscribed range, i.e., glowing transfer base weight is in a total amount between 5% to 10%, the glowing material between 10–40%, the CMYK glowing translucent inks between 5–15%, and between 50–75% for the glowing puff material. The invention is not limited in scope to the above concentration ranges, with the exception of the glowing heat transfer base. The glowing transfer base composition percentages are critical to this invention since levels above the indicated amount may produce excess amounts of polyvinyl chloride, leading to the potential health risks discussed above.

In accordance with one aspect of the invention, a method of making a glowing puff heat transfer material is provided. The method comprises the steps of creating a design and storing the design on a computer as a computer image, and separating the computer image into one or more separate computer-generated color images. Each of the one or more separate computer-generated color images are then transferred onto a color-sensitive medium to create one or more separate color layers. One or more glowing inks are applied to the one or more separate color layers, where each of the one or more glowing inks corresponds to one of the separate color layers. Separate material layers preferably comprised of a glowing transfer base material, a glowing material and a glowing puff material, are prepared and applied, along with the separate color layers, to a substrate.

In accordance with another aspect, the invention is a glowing heat transfer composition comprised of a glowing base material, a glowing material, a glowing puff material, and one or more glowing inks.

Accordingly, it would be desirable to provide a glow-in-the-dark heat transfer process that results in a heat transfer having bright colors without the use of toxic ingredients often found in transfer base materials.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

The method of making a heat transfer follows three major stages: design and film preparation, preparing and shouting the image onto a mesh or screen, and printing the image onto a substrate. The steps collectively illustrated in FIGS. 1 and 2 represent an exemplary embodiment of the inventive method.

Figure 1:
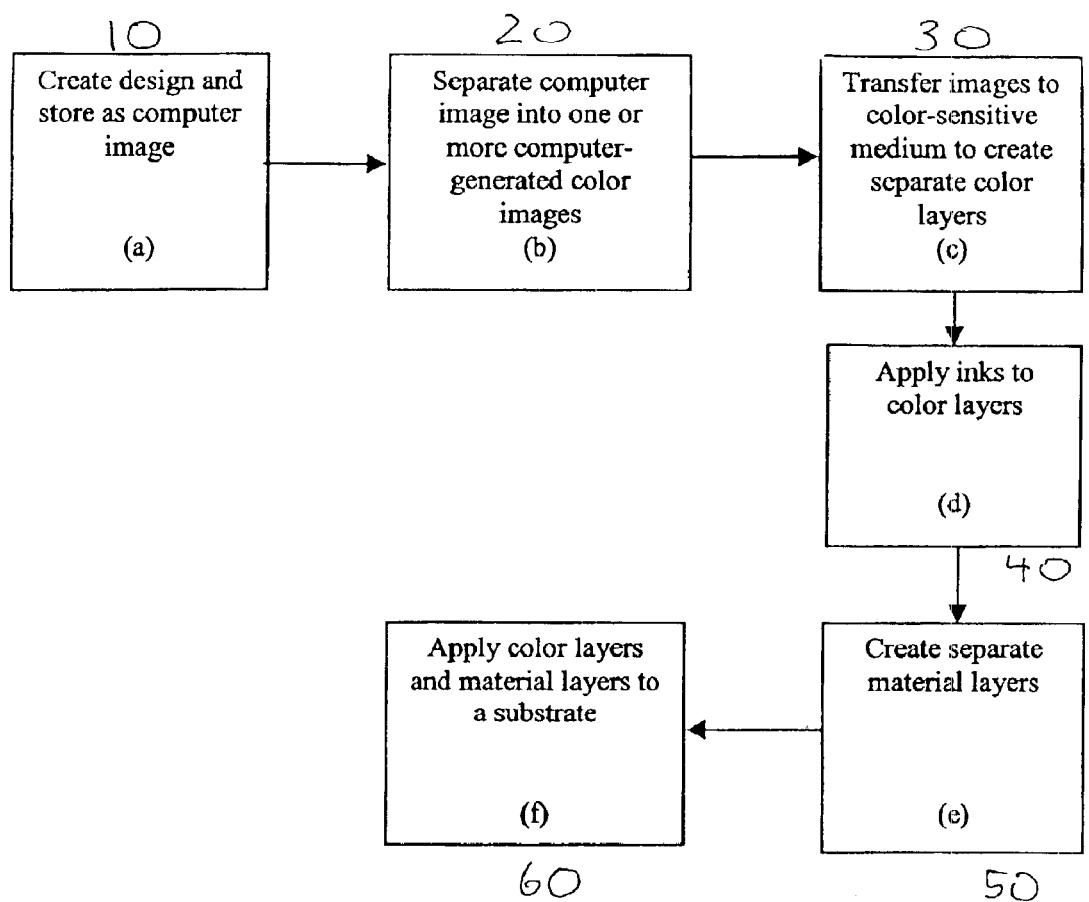
FIG. 1 represents a flowchart illustrating the steps performed by the present invention.

FIG. 1 illustrates an exemplary embodiment of the steps performed by the present invention. The first step in the process of making a glow-in-the-dark heat transfer material utilizing the inventive method described herein is to choose an artistic design, and replicating and storing the design on a computer using standard computer design generation software commonly known in the art, step 10. The computer image is then separated into one or more color images, via step 20. The separate color images are then transferred to a color-sensitive medium to create one or more separate color layers, step 30.

Figure 2:
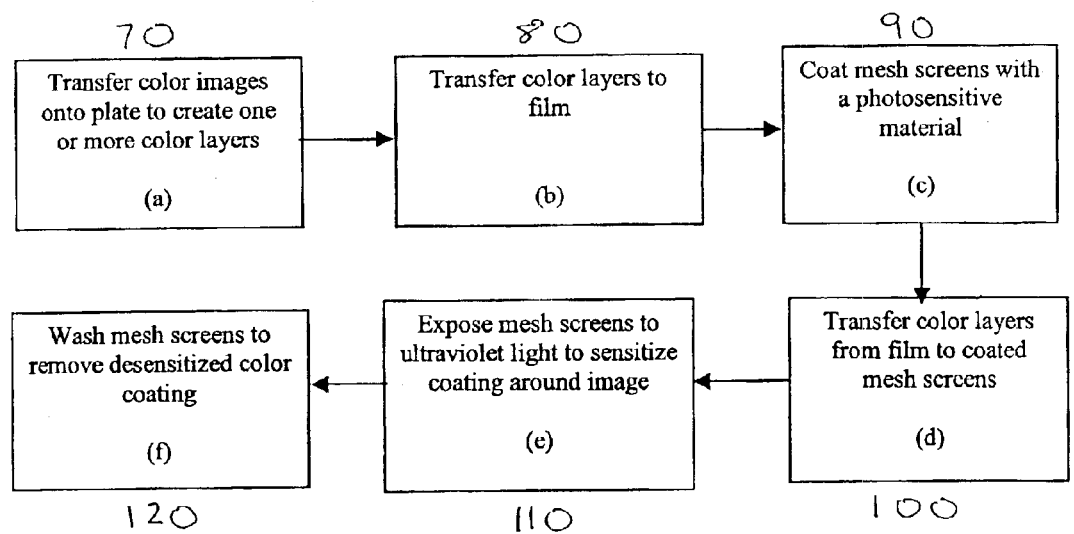
FIG. 2 represents a flowchart illustrating in greater detail the steps performed in step (c) of the method shown in FIG. 1.

The features of step 30 in FIG. 1 are represented in greater detail in FIG. 2. After separation of the computer image into separate color images, each color image is transferred onto a separately labeled plate via step 70, the label identifying the color image. The image on each plate is transferred to an image-setter, which prints each image on an acetate film, step 80. A series of mesh screens are then coated with a photosensitive emulsion, step 90, and each separate film is affixed to the coated mesh screen, step 100. The mesh screens are then exposed to an ultraviolet light that sensitizes the coating around the image, step 110. The desensitized coating under the image is washed away, via step 120, leaving only the desired image on the mesh screen.

Referring once again to FIG. 1, glowing inks are then applied to the remaining color layers on the screen, step 40. The glowing transfer base and the glowing material, collectively referred to as the material layers are created, step 50, and are applied, along with the color layers, to the substrate, step 60.

Figure 3:
FIG. 3 depicts a top view of a heat transfer material.

FIG. 3 represents a piece of heat transfer material 130 created by a process common in the art. The material 130 consists of a plurality of translucent inks. When the heat transfer material 130 is applied, face down, onto a piece of fabric using an iron-on pressing machine, the temperature heats the inks to its melting temperature and the pressure releases the melted inks to adhere onto the fabric. The paper substrate is then removed to leave behind, on the fabric, the same design created in the art stage and stored on the computer as the compute image.

Figure 4A:
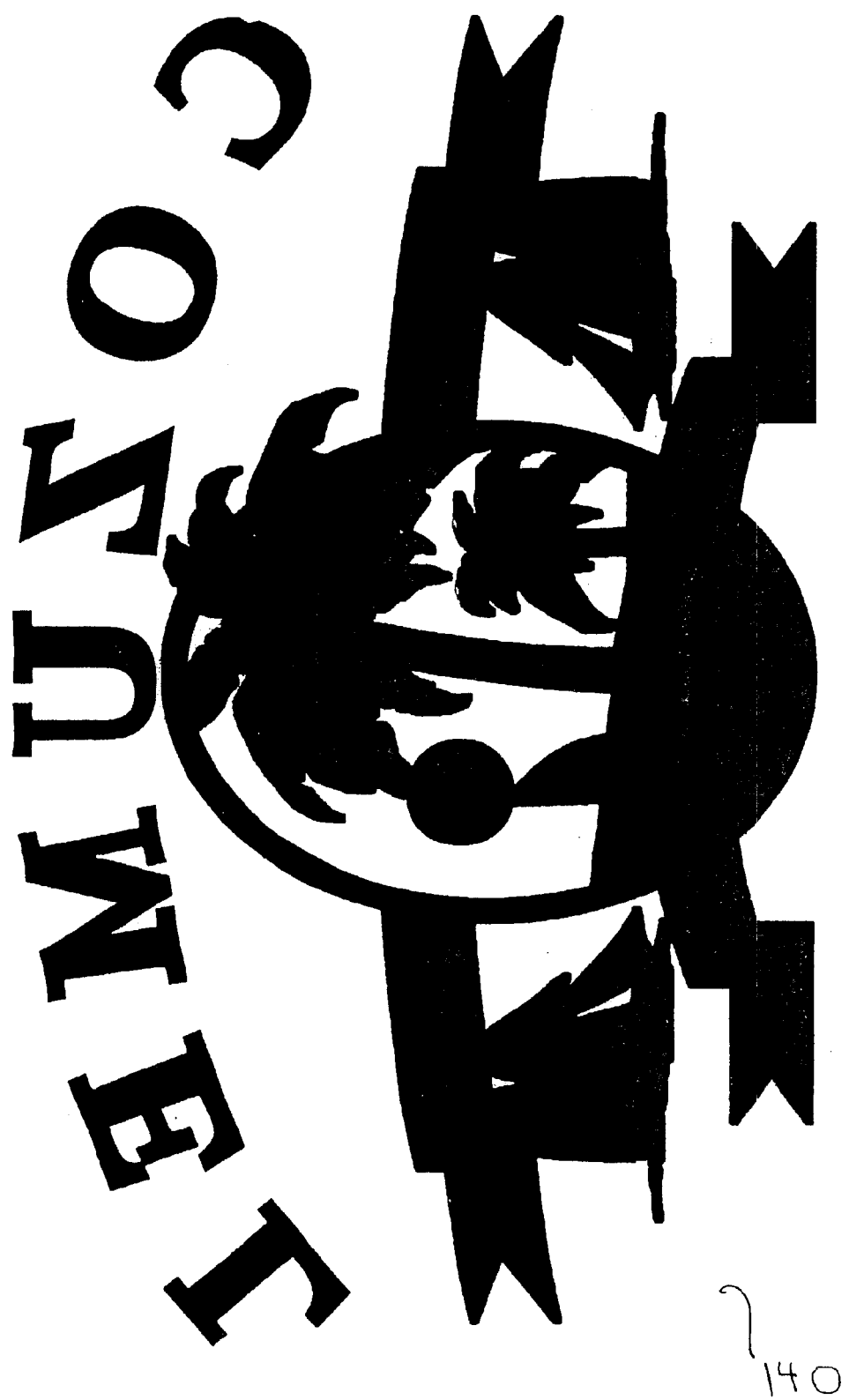
FIGS. 4a–4f depict six layers or colors separations of the image in FIG. 3.
Figure 4B:
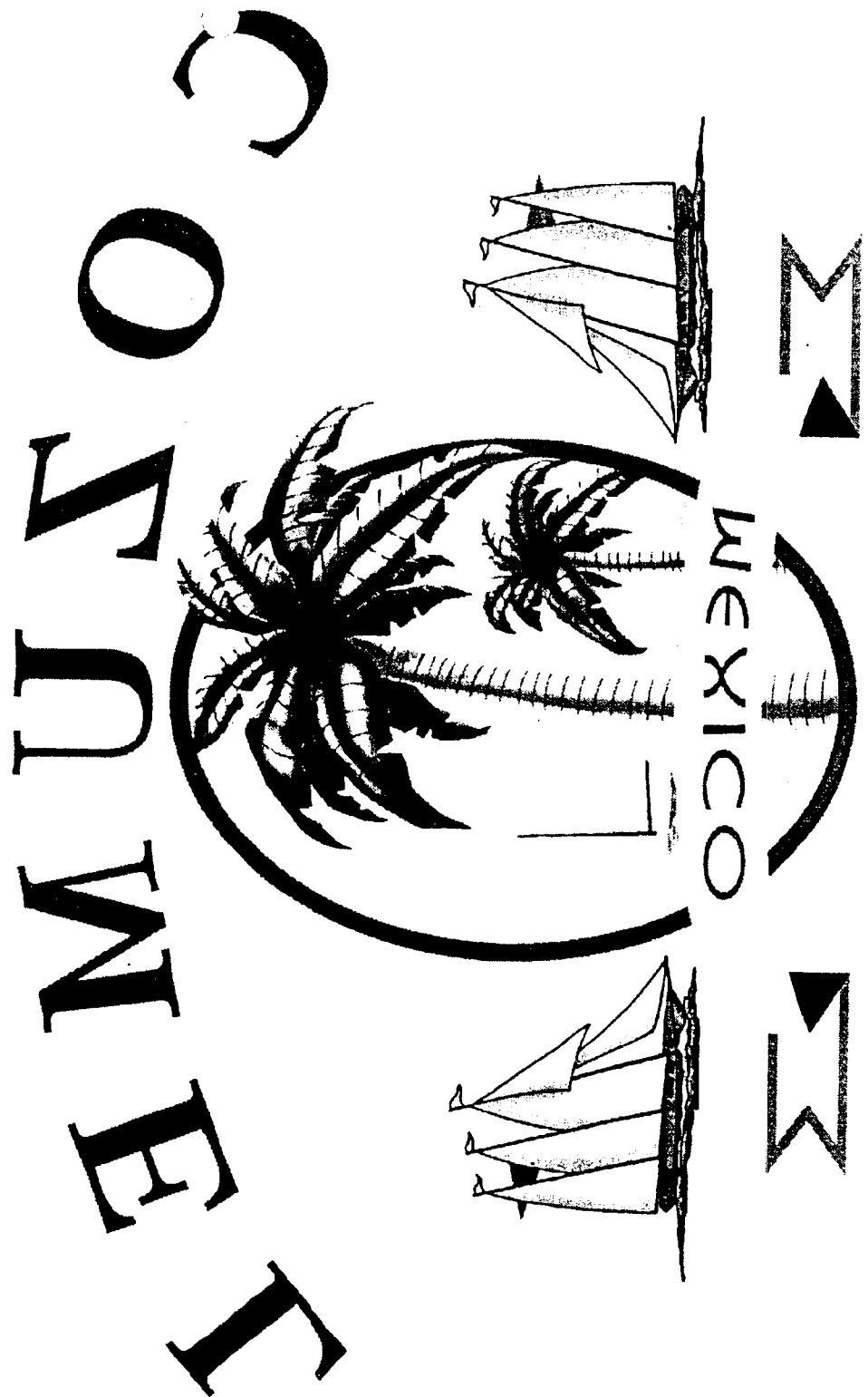
Figure 4C:
Figure 4D:
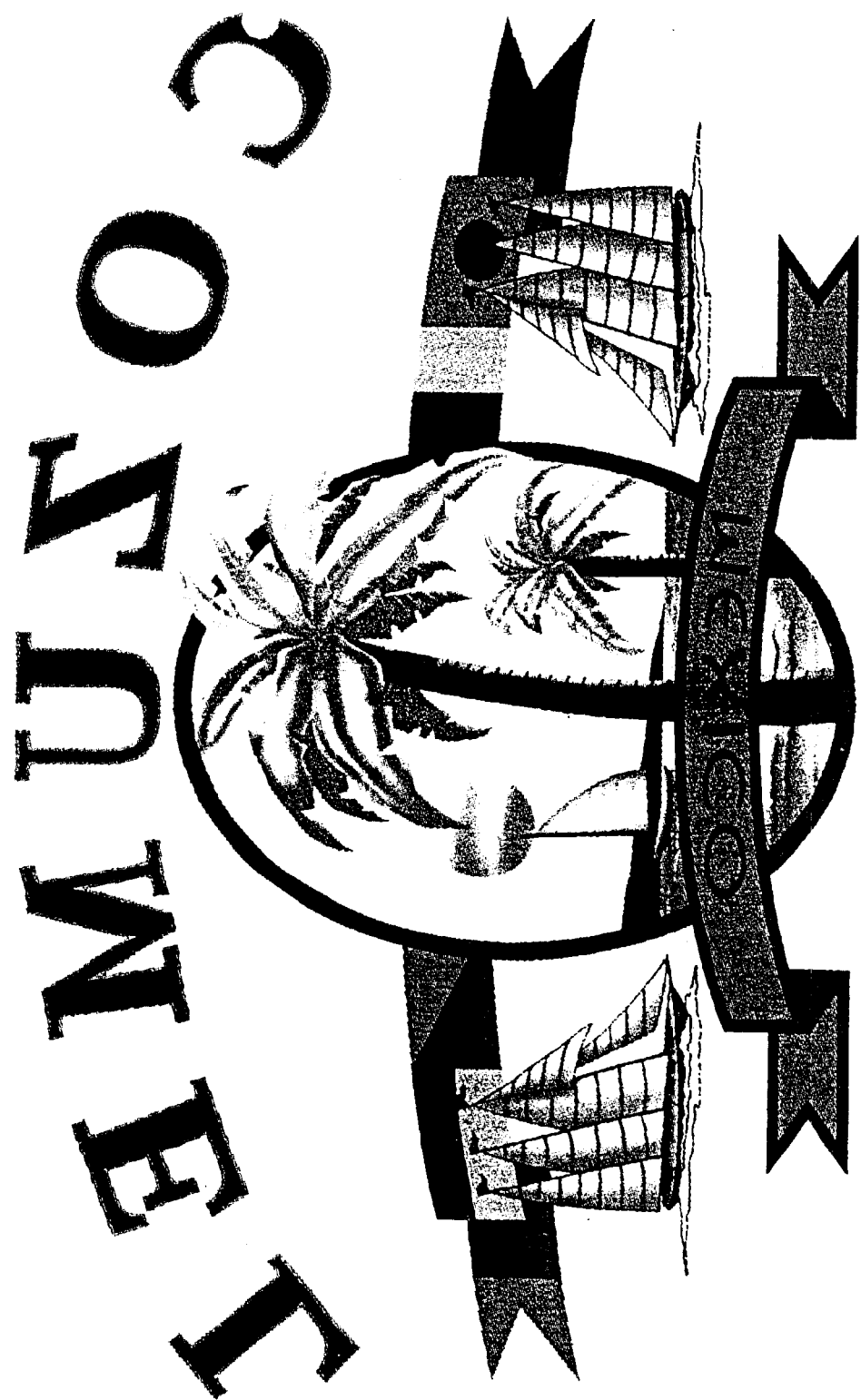
Figure 4E:
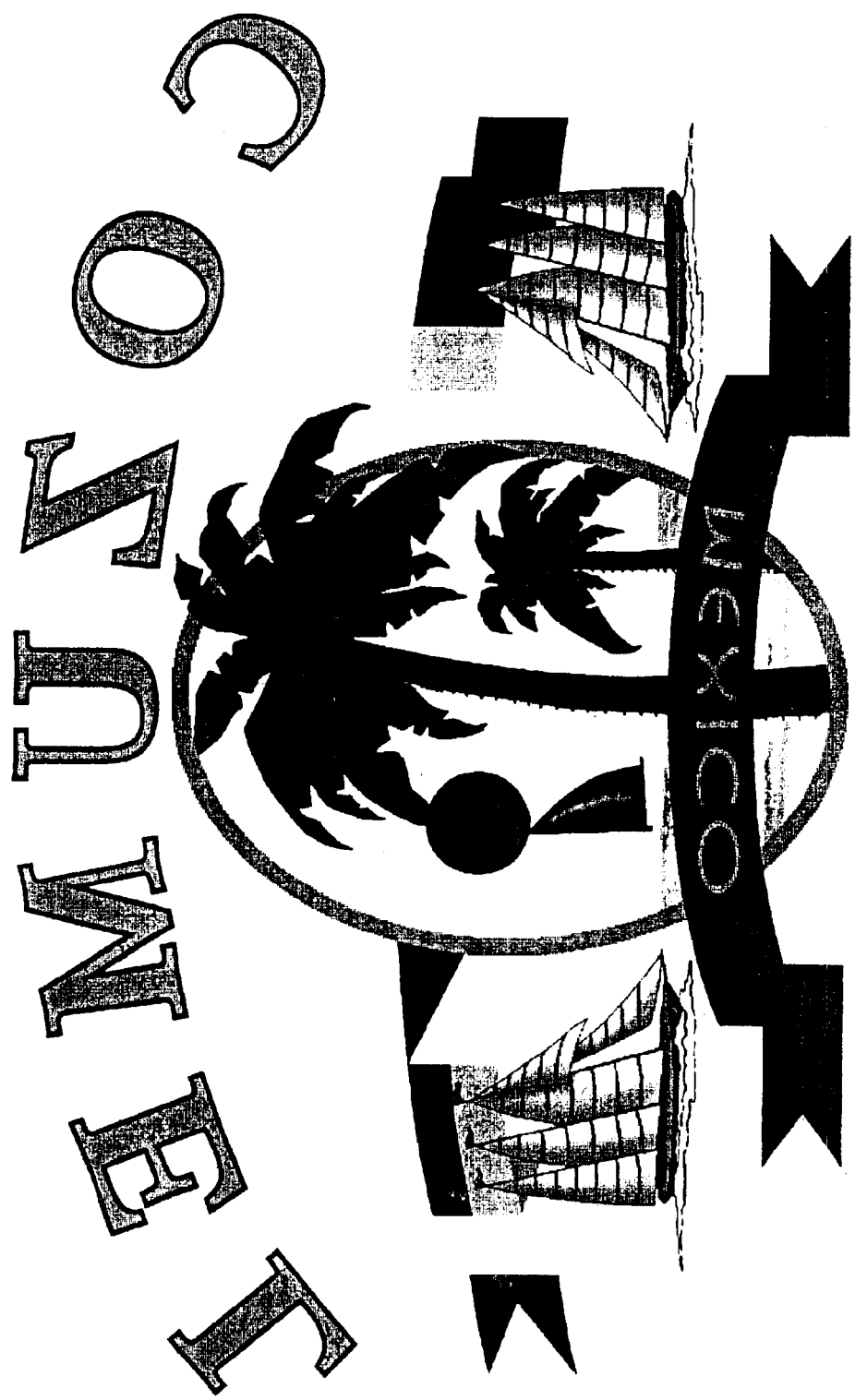
Figure 4F:
Figure 5:
FIG. 5–FIG. 10 depict the four glowing color layers, the glowing puff layer and the glowing material layer used in the present invention.
Figure 6:
Figure 7:
Figure 8:

FIGS. 4A–4F represent the six different layers of ink that are combined to form the final image 130. FIG. 4A represents the transfer base 140, which is the first layer or spot layer. This is the first layer applied on the substrate to enable the ink to be released from the paper. The next four layers (FIGS. 4B–4E) applied to the substrate are the four translucent colors (for example, cyan, magenta, yellow, and black), although not necessary in that particular order. These layers are applied to the substrate on top of the first layer, the transfer base 140. The image on these layers is comprised of dots distributed in specific angles and proportions and positioned in a certain way that is controlled by the computer. The angle, position, and the size of the dots determine the final colors and shades of the image. For example, a cyan dot having the same size and positioned at the same angle as a yellow dot, when combined together, results in a green dot. A magenta dot from the magenta plate and a yellow dot from the yellow plate will result in a red dot. The formation of the four color layers as a whole will result in a large matrix of pantone colors and their shades. The last layer, FIG. 4F, represents the puff layer 150, which can cover the entire design, or a portion thereof, to provide a full opaque print with a high-raised texture that can be applied on any colored fabric.

Figure 9:

FIG. 5 through FIG. 10 represent the glowing color layers, the glowing puff layer, and the glowing material layer, respectively, that can be created for the GWPHT presented in this invention. A first layer (not shown) is the glow transfer base layer, which, preferably, should cover all sections of the design to secure perfect release of the inks from the substrate. The second, fourth, sixth, eight, tenth and twelfth layers are, preferably, the glowing material layers (not shown), which determine the glowing sections chosen by the artist to glow in the dark. These layers are chosen to cover the entire design. The third, fifth, seventh and ninth layers, shown respectively in FIGS. 5–8, are, preferably, the glowing four-color layers that work in the same manner as illustrated above in FIGS. 4B–4E in addition to the glowing agent that is mixed into each color. The fourth, sixth, eighth and twelfth layers can be totally or partially eliminated according to the intensity and period of glowing. The best results are achieved when all layers are working in conjunction with each other. The eleventh layer, shown in FIG. 9, is the glowing puff layer 160 of the transfer after application.

Preferably, the second layer, which is the glowing material, is smaller in size than the first layer (the glowing transfer base). Preferably, the size of the glowing material layer is smaller than the first layer by 1 point to achieve exact registration and secure a full release of the transfer at the edges.

Figure 10:

FIG. 9 illustrates the glow puff layer 160, which is, preferably, the eleventh layer to be applied to the substrate. The glow material layer 170 is layer number twelve and is illustrated in FIG. 10. Glow material layer 170 is preferably smaller than the glow puff layer 160, by approximately 2 points, for the same reasons mentioned above. Preferably, a majority of the cuts are created on glow puff layer 160 in about 4 points in width. These cuts are made to provide a two dimensional effect on the image after the transfer is applied. The width of these cuts can be determined by trial and error from the expansion of the glow puff material after application.

After the image is separated and the layers are printed on a clear acetate material, each layer is ready to be shouted on a mesh or screen. The screening stage starts by coating the stretched mesh with a photosensitive coating called emulsion. After the emulsion is dried, the positive acetate films are pasted on the back of the screen and exposed to an ultraviolet light. The screen is then washed by water and thoroughly dried. For each layer created during the art stage, a screen will be made and prepared for printing. In the present invention, two factors are controlling the screening process, the mesh size, and the thickness of the coating applied on the mesh. These two factors actually control the deposit of the ink to be laid down on the substrate, where a smaller mesh count and less coating thickness result in less ink weight deposited onto the substrate.

Preferably, the first and second screens (corresponding to as the first and second layers identified above) are chosen to have a mesh count of approximately 330 and a coating thickness of approximately 0.5 mils to insure that the specific weight is less than 10% of the total transfer weight. The third, fifth, seventh, and ninth screens (corresponding to the third, fifth, seventh, and ninth screens described above) are preferably chosen to have a mesh count of approximately 330 and a coating thickness of approximately 0.20 mils. The fourth, sixth, eighth, tenth, and twelfth screens (corresponding to the fourth, sixth, eighth, tenth, and twelfth screens described above) preferably have a mesh count of approximately 420 and a coating thickness of approximately 0.15 mils. The eleventh screen (corresponding to the eleventh layer) preferably has an 83-mesh count and a 2.0 mill coating thickness to secure a large ink deposit.

The glow transfer base used in the present invention is preferably comprised of a specially-made material preferably comprised of LUMIGLOW powder, plasticizer, adhesive and resin, mixed together in a ratio of about 1:4:1:13, respectively. LUMIGLOW powder is a photoluminescent glow-in-the-dark powder pigment. The glow material used in the present invention is preferably comprised of an AQUABOND base, which is a screen printable adhesive used in heat transfers, mixed with LUMIGLOW powder in a ratio of about 9:1. The glow translucent inks are glow cyan, glow magenta, glow yellow, and glow black, wherein the LUMIGLOW powder is mixed with the traditional translucent inks (cyan, magenta, yellow, and black) in a ratio about 1:9 LUMIGLOW powder to each translucent ink. The glow puff material 160 is a specially-made material comprised of LUMIGLOW powder, resin, adhesive, plasticizer and blowing agent mixed together in a ratio of approximately 1:10:2:6:1, respectively.

The last stage in the process of the present invention is the printing process where, preferably, a cylinder or flat bed machine is used to print the desired image. Each screen is loaded into the machine with the required ink material, and then cured in a conventional gas dryer at a temperature between approximately 275° F. and 325° F., preferably at a belt speed of approximately 90 ft/min.

In order to comply with OSHA regulations, it is necessary to determine the maximum weight percentage of the glow base material, and maintain this percentage under a manageable range. In test results, several samples were printed using the traditional composition of a puff heat transfer with percentages of transfer base material varying between 25% and 40%, translucent ink varying between 10% and 25%, and the puff material varying between 35% and 65%. Ten transfers of each sample listed in Table 1 were applied to a fabric in a period of 15 minutes and a gas chromatograph was used to measure the concentration of vinyl chloride in the atmosphere surrounding the user. Using the manufacturer's instructions for the above device, the concentration in ppm (parts per million) is calculated and listed in Tables 1 and 2.

TABLE 1 percentage of each composition by weight.

| | Transfer Base Material | Cyan | Magenta | Yellow | Black | Puff | PPM |
|---|---|---|---|---|---|---|---|
| Sample A | 25 | 5 | 2.5 | 7.5 | 2.5 | 57.5 | 12 |
| Sample B | 29 | 7 | 3.5 | 3.5 | 3.5 | 53.5 | 14 |
| Sample C | 28 | 5 | 2 | 2 | 2 | 61 | 14 |
| Sample D | 37 | 7 | 5 | 10 | 2 | 39 | 18 |
| Sample E | 37 | 5 | 5 | 10 | 2 | 41 | 18 |

TABLE 2 percentages of backing, translucent ink and puff by weight.

| | Transfer Base Material | Translucent Color | Puff | PPM |
|---|---|---|---|---|
| Sample A | 25 | 17.5 | 57.5 | 12 |
| Sample B | 29 | 17.5 | 53.5 | 14 |
| Sample C | 28 | 11 | 61 | 14 |
| Sample D | 37 | 24 | 39 | 18 |
| Sample E | 37 | 22 | 41 | 18 |

According to OSHA regulation 29 CFR.1910, the concentration of vinyl chloride should not exceed 5.00 ppm in a period of 15 minutes. Since all transfer base material used in manufacturing heat transfers contains significant amounts of polyvinyl chloride, it is critical to monitor the amount of transfer base material used. In test indicated by the tables above, the maximum percentage by weight for the transfer base material or the glow base was found not to exceed 10%.

The present invention advantageously provides a unique method of producing puff heat transfers which provide not only glow-in-the-dark transfers but also eliminates toxic vapors that might normally be inhaled by the user during traditional heat transfer processes. The heat transfer process of the present invention takes into account the potentially damaging effects of toxic inhalation and maintains strict adherence to OSHA regulations.

In another embodiment of this invention, the weight percentage of the glow transfer base varies between 5% and 10% and more preferably 10%, the glow material between 7% and 20%, the glow translucent inks vary between 5% and 15% in total and the glow puff material between 40% and 70%. At least one of the four translucent inks was used.

EXAMPLE 1

A GWPHT was made by using full color pallets comprised of glowing cyan, glowing magenta, glowing yellow, and glowing black. The glowing base was printed first, the glowing material second followed by the four glowing inks. After the application of each glowing ink, another glowing material was printed. The glowing puff material was then printed and coated with printable adhesive. The following composition was used in this example:

| Material | Weight (grams) | % By Weight |
|---|---|---|
| Glow Base | 0.5 | 8% |
| Glow Material | 0.43 | 7% |
| Glow Cyan | 0.125 | 2% |
| Glow Material | 0.43 | 7% |
| Glow Magenta | 0.125 | 2% |
| Glow Material | 0.43 | 7% |
| Glow Yellow | 0.19 | 3% |
| Glow Material | 0.43 | 7% |
| Glow Black | 0.06 | 1% |
| Glow Material | 0.43 | 7% |
| Glow Puff | 2.6 | 42% |
| Printable Adhesive | 0.43 | 7% |

The above amounts are based on a 34.5 cm×29.5 cm transfer with an image of 28.5 cm×22 cm.

EXAMPLE 2

A GWPHT was made from a composition of the following: glow base, glow material, glow cyan, glow puff, and glow material with weights of 0.46, 0.70, 0.35, 3.42 and 0.87 grams respectively, or percentages, by weight, of 8%, 12%, 6%, 59%, and 15% respectively. The same size of transfer and image was used as in the previous example. The transfer resulted from the above composition showed only a cyan color that glowed in the dark with less image detail.

EXAMPLE 3

A GWPHT was made from a composition of the following: glow base, glow material, glow magenta, glow puff, and glow material with percentages, by weight, or 5%, 20%, 8%, 52% and 15% respectively. The transfer after application showed the concentrated magenta color having a high level of glowing features since the glowing material total percentage by weight was 35%.

EXAMPLE 4

A GWPHT was made with the highest amount of glow puff material and more concentrated glow yellow ink, where the percentages of the glow base and the glow material were kept within the average effective amount. The composition of the GWPHT was 0.65, 1.30, 0.65 and 6.8 grams of the glow base, glow material, glow yellow and glow puff, respectively. In this embodiment, the final glow material was not applied since a large amount of the glow puff material was used. The image after application did not show specific detail because of the lightness of the yellow ink, but still attained satisfactory results.

EXAMPLE 5

In this example the glow base and the glow material had the same weight percentage and a large amount of glow puff material was used. The composition of this embodiment was: 0.7, 0.7, 0.65 and 4.5 grams of the glow base, glow material, glow black and glow puff material, respectively. A high-raised texture and acceptable glow were achieved despite using the minimum percentage of the glowing material.

EXAMPLE 6

The best results were achieved from the following composition: 0.7, 0.7, 0.3, 0.3, 0.3, 0.4, and 4.0 grams of the glow base, glow material, glow cyan, glow magenta, glow black, glow yellow and glow puff material, respectively. Only one glow material layer was used after the glow base and all other glow material layers were skipped. Using the above composition, a bright, detailed, glow-in-the-dark heat transfer product was attained, having a high raised texture, and complying with OSHA regulations.

Ten transfers of each example mentioned above were tested for vinyl chloride concentration using the same procedure and apparatus mentioned previously. The results are shown below.

| | % By Weight | | | | | | | | | | | | |
|---|---|---|---|---|---|---|---|---|---|---|---|---|---|
| Example | GS | GM | GC | GM | GG | GM | GY | GM | GB | GM | GP | GM | PPM |
| 1 | 8 | 7 | 2 | 7 | 2 | 7 | 3 | 7 | 1 | 7 | 42 | 7 | 4 |
| 2 | 8 | 12 | 6 | | | | | | | | 59 | 15 | 4 |
| 3 | 5 | 20 | | | 8 | | | | | | 52 | 15 | 2.5 |
| 4 | 9 | 14 | | | | | 9 | | | | 73 | | 4.5 |

-continued

| Example | GS | GM | GC | GM | GG | GM | GY | GM | GB | GM | GP | GM | PPM |
|---|---|---|---|---|---|---|---|---|---|---|---|---|---|
| | | | | | % By Weight | | | | | | | | |
| 5 | 10 | 10 | | | | | | | 9 | | 69 | | 5 |
| 6 | 10 | 10 | 5 | | 5 | | 6 | | 5 | | 59 | | 5 |

GS = Glowing base,
GM = Glowing material,
GC = Glowing cyan,
GG = Glowing magenta,
GY = Glowing yellow,
GB = Glowing black,
GP = Glowing puff,
PPM = Parts per million.

The present invention is not limited to the kind of paper substrate used. The composition can be deposited onto any suitable printable paper. The best results were achieved from an ultra strip 2000 paper manufactured by Burkhardet and Freeman where a DEA coating was loaded onto the paper during its manufacturing stage. This paper has undergone many trial tests since 1995 and found to have the most appealing image after application while providing a transfer material that does not have an expired shelving period.

The present invention exhibits yet another advantage in that it requires only a maximum of 3 seconds for the applicant or the end user to apply the GWHPT to the iron-on machine. Therefore, production time is decreased by up to 70% when compared to any other transfer process which requires at least 10 seconds. This advantage is derived from the unique process of the present invention that utilizes a low-percentage weight of glow transfer base and improved glow puff material.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of making a glowing puff heat transfer material comprising the steps of:
    (a) creating a design and storing the design on a computer as a computer image;
    (b) separating the computer image into one or more separate computer-generated color images;
    (c) transferring each of the one or more separate computer-generated color images onto a color-sensitive medium to create one or more separate color layers; wherein the step of transferring each of the one or more separate computer-generated color images on a color-sensitive medium comprises the steps of:
        transferring each of the separate computer-generated color images onto a plate to create the one or more separate color layers, each of the plates receiving one of the one or more separate color layers;
        transferring each of the one or more separate color layers to film;
        coating one or more mesh screens with a photosensitive material;
        after the photosensitive material has dried, transferring the one or more separate color layers from the film to the one or more mesh screens whereby each mesh screen receives one color layer;
        exposing the one or more mesh screens to ultraviolet light, the ultra violet light sensitizing an area around each color layer while leaving the coating under each color layer desensitized; and
        washing the plurality of screens to remove the desensitized color images
    (d) applying one or more glowing inks to the one or more separate color layers, wherein each of the one or more glowing inks corresponds to one of the separate color layers, the one or more glowing inks comprised of a photoluminescent glow-in-the-dark powder;
    (e) creating separate material layers; and
    (f) applying the separate color layers and the separate material layers to a substrate.

2. A glowing heat transfer composition comprising a glowing base material, a glowing material, a glowing puff material, and one or more glowing inks, wherein at least one of the glowing base material, the glowing material, the glowing puff material and the one or more glowing inks are comprised of a photoluminescent glow-in-the-dark powder.

3. The composition of claim 2 wherein the glowing base material is comprised of a photoluminescent glow-in-the-dark-powder, plasticizer adhesive and resin.

4. The composition of claim 2 wherein the glowing material is comprised of a printable adhesive base mixed with a photoluminescent glow-in-the-dark powder wherein the glowing base material is in an amount of no more than 10% by weight of the glowing puff heat transfer material.

5. The composition of claim 2 wherein the glowing puff material is comprised of a photoluminescent glow-in-the-dark powder, resin, adhesive, plasticizer and a blowing agent.

6. The composition of claim 2 wherein the one or more glowing inks are comprised of translucent inks and a photoluminescent glow-in-the-dark powder.

7. The composition of claim 2 wherein the glowing base material is in an amount of between 5% and 10% by weight, the glowing material is in an amount of between 10% to 40% by weight, the separate color layers are in an amount of between 5% to 15% by weight, and the glowing puff material is in an amount of between 50% to 70% by weight.

* * * * *